(12) United States Patent  
Zeyen et al.

(10) Patent No.: US 9,315,375 B2  
(45) Date of Patent: Apr. 19, 2016

(54) METHOD USING GLASS SUBSTRATE ANODIC BONDING

(71) Applicant: Innovative Micro Technology, Goleta, CA (US)

(72) Inventors: Benedikt Zeyen, Santa Barbara, CA (US); Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 265 days.

(21) Appl. No.: 14/142,712

(22) Filed: Dec. 27, 2013

(65) Prior Publication Data

US 2015/0183200 A1    Jul. 2, 2015

(51) Int. Cl.
| | | |
|---|---|---|
| *B81B 1/00* | (2006.01) | |
| *B32B 37/00* | (2006.01) | |
| *B81C 1/00* | (2006.01) | |
| *B81B 7/00* | (2006.01) | |
| *B32B 37/12* | (2006.01) | |

(52) U.S. Cl.
CPC ............... *B81B 1/00* (2013.01); *B32B 37/0084* (2013.01); *B81C 1/00269* (2013.01); *B32B 2037/1269* (2013.01); *B81B 7/00* (2013.01); *B81C 2203/019* (2013.01); *Y10T 428/13* (2015.01); *Y10T 428/24851* (2015.01); *Y10T 428/24975* (2015.01); *Y10T 428/31536* (2015.04)

(58) Field of Classification Search
CPC ........ B81B 7/00; B81B 1/00; B81C 1/00269; B81C 2203/019; B32B 37/0084; B32B 2037/1269
USPC .................................... 156/99, 104, 106, 107
See application file for complete search history.

(56) References Cited

U.S. PATENT DOCUMENTS

2005/0212111 A1* 9/2005 Terazaki ............. B81C 1/00119
  257/686
2007/0048898 A1* 3/2007 Carlson ............... B81C 1/00269
  438/106

\* cited by examiner

*Primary Examiner* — Philip Tucker
*Assistant Examiner* — John Blades
(74) *Attorney, Agent, or Firm* — Jaquelin K. Spong

(57) ABSTRACT

A bonding technology is disclosed that can form an anodic, conductive bond between two optically transparent substrates. The anodic bond may be accompanied by a metal alloy, solder, eutectic and polymer bond. The first anodic bond may provide one attribute such as hermeticity, whereas the second bond may provide another attribute, such as electrical conductivity.

19 Claims, 11 Drawing Sheets

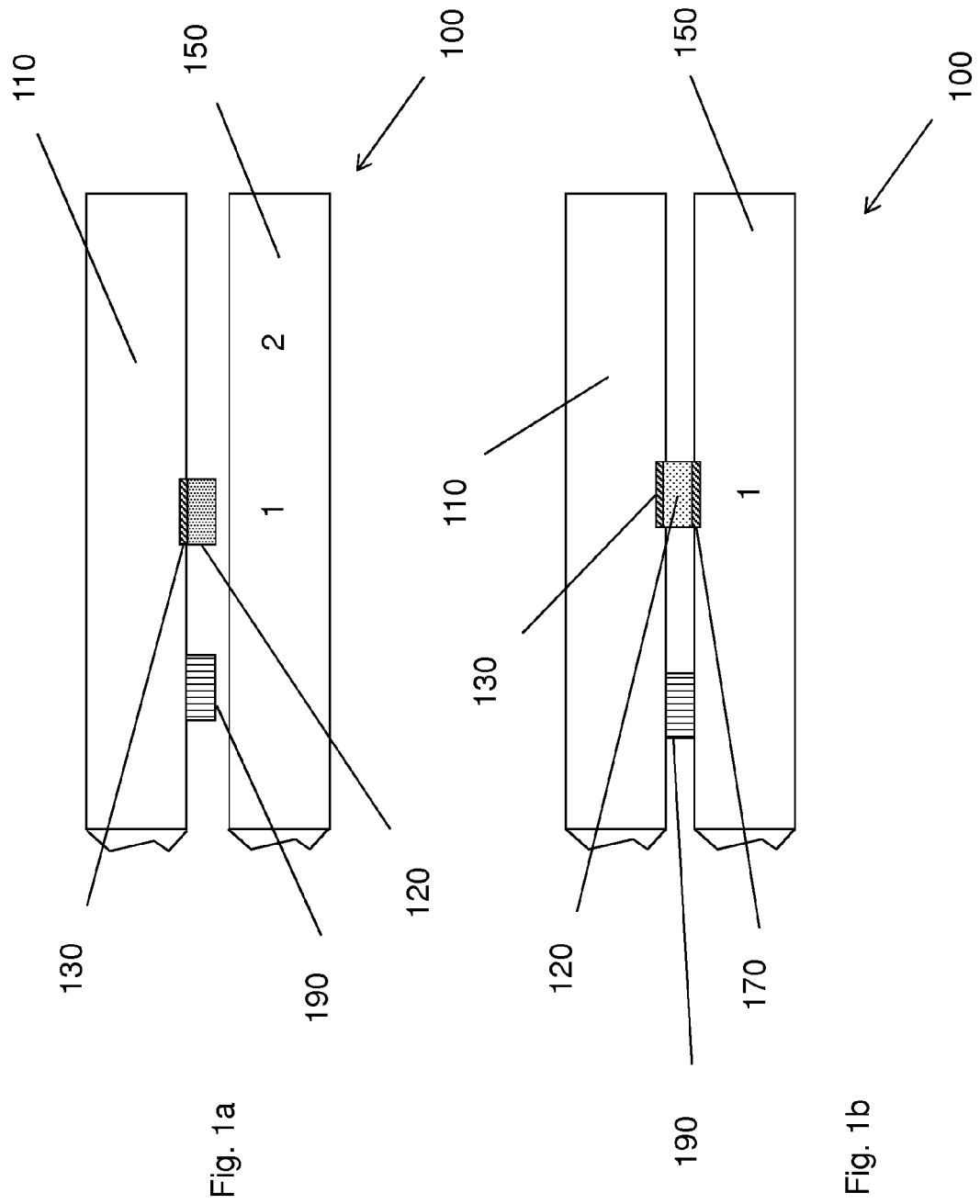

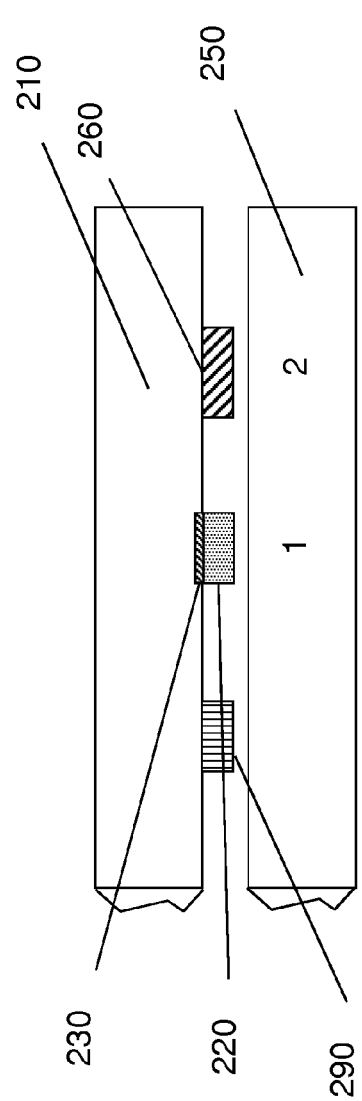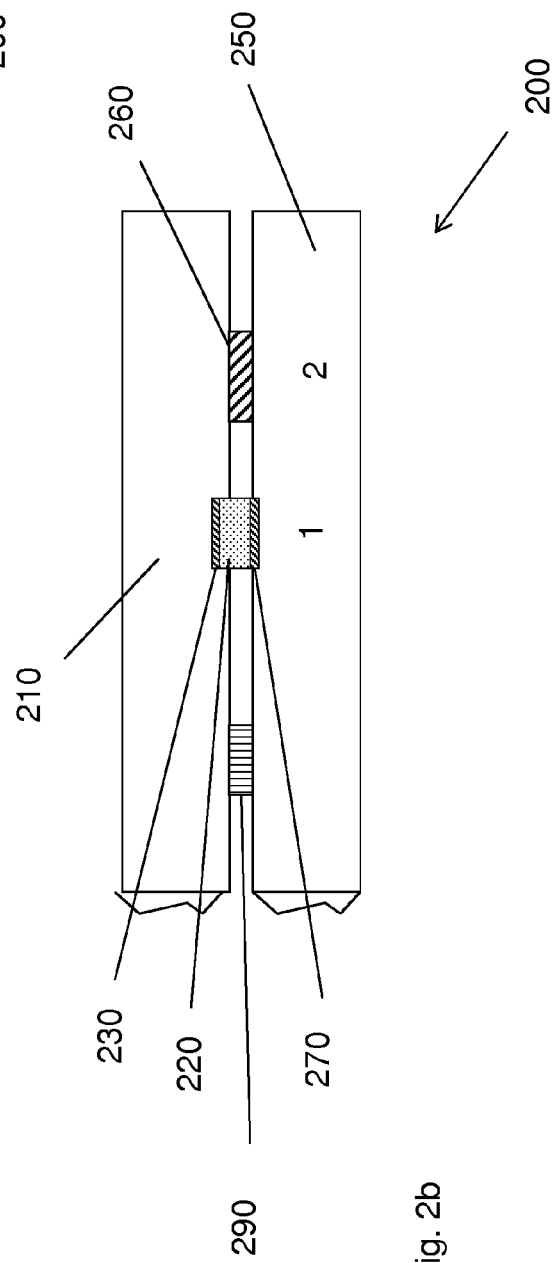

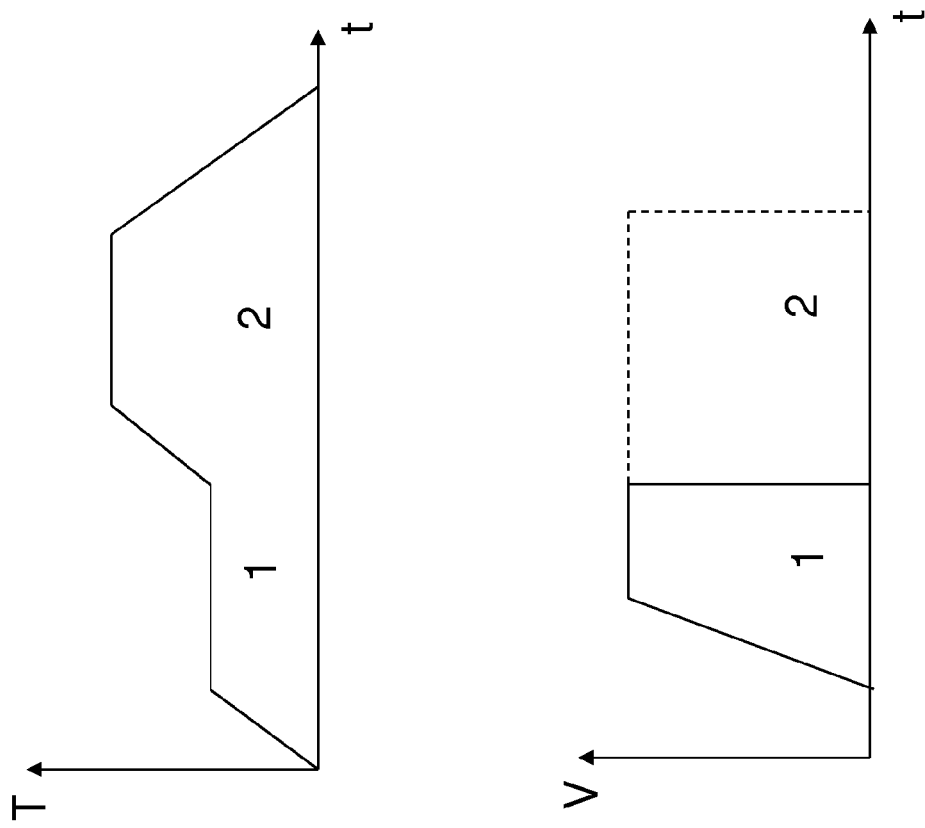

METHOD USING GLASS SUBSTRATE ANODIC BONDING

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a methodology for bonding together two microfabrication substrates.

Microelectromechanical systems are devices which are manufactured using lithographic fabrication processes originally developed for producing semiconductor electronic devices. Because the manufacturing processes are lithographic, MEMS devices may be made in very small sizes. MEMS techniques have been used to manufacture a wide variety of transducers and actuators, such as accelerometers and electrostatic cantilevers.

MEMS devices are often movable, they may be enclosed in a rigid structure, or device cavity formed between two wafers, so that their small, delicate structures are protected from shock, vibration, contamination or atmospheric conditions. Many such devices also require an evacuated environment for proper functioning, so that these device cavities may need to be hermetically sealed after evacuation. Thus, the device cavity may be formed between two wafers which are bonded using a hermetic adhesive.

Deposition techniques for the thin layers used in semiconductor and MEMS devices often leave gases incorporated in the layers during deposition. These devices may then be encapsulated in the evacuated cavity for proper functioning. However, the gases incorporated in the films may escape from the layers during the devices' lifetimes, raising the pressure in the evacuated cavities. Therefore, depending on the degree of vacuum needed, a gettering material may also be enclosed in the device cavity for continuous absorption of contaminant gases.

Accordingly, many designs include such a getter material, which is typically a reactive, metal layer, whose purpose is to absorb these gases by oxidation, in order to maintain the vacuum levels within the package. Because of the reactive nature of these materials, they also tend to oxidize spontaneously at the surface, forming an oxide layer that must be removed in order to activate the getter. Activation of the getter may require exposure to high temperatures, temperatures consistent with bonding using glass frit, as described below.

Devices which use or manipulate electromagnetic radiation, such as emitters, reflectors, absorbers, gratings, and the like, may require encapsulation in an optically transmissive device cavity to function effectively. Glass wafers would provide such a cavity. However, a hermetic seal around a glass cavity typically requires a glass frit adhesive, which may require processing temperatures in excess of 400 C. to melt and fuse the frit. Although these temperatures may also be adequate to activate the getter, they may also exceed the temperatures that can be withstood by many of the thin metal layers used to create the optical device. Thus, encapsulation of an optical device in a transparent device cavity which is hermetically sealed has been an elusive goal.

Anodic bonding of a glass substrate to a silicon substrate is known, wherein voltage and heat are applied between the glass wafer and the silicon wafer. The voltage applied promotes the growth of the oxide layer between the silicon and the glass, which adheres the materials together. However, this method requires one of the wafers be a silicon wafer, which, of course, is not transmissive to most portions of the electromagnetic spectrum, including the visible portion.

Accordingly, the packaging of optical devices in a hermetic glass cavity remains an unresolved problem.

SUMMARY

Many devices require a transmissive material for the device wafer and/or the lid wafer, in order for the produced, emitted or altered electromagnetic radiation to be transmitted to or from the device cavity. Infrared emitters, detectors, attenuators, grating and mirrors for example, require encapsulation in infrared transmissive materials. Glass is a popular wafer material, however, glass is generally an insulating material. As a result, anodic bonding between two glass wafers is not possible, because the voltage cannot be applied to the insulating material properly. Also, it is often desired for the bonding material to be conductive, so as to provide an electrical pathway between structures on either substrate. Therefore a need exists for a packaging technology which can bond two optically transparent substrates with a conductive bond.

The systems and methods described here provide an electrically conductive, anodic bond between two optically transparent wafers. The method uses ion-rich, nominally conductive optically transparent layers such as Borofloat® or Pyrex® glass substrates. The method includes the deposition of a layer of silicon on one of the optically transparent substrate, and the mating of this substrate with a second optically transparent substrate to form a substrate assembly. The application of temperature and voltage to the substrate assembly and the resultant formation of a second oxide layer that bonds the silicon to the second optically transparent substrate.

More specifically, the method may include providing a first optically transparent substrate and a second optically transparent substrate, depositing a first layer of metal material on the first optically transparent substrate, forming a first layer of metal oxide material wherein the metal oxide is the oxidation product of the metal material and the first optically transparent substrate, and is formed during the depositing of the metal material, patterning the first layer of the metal material to create a metal feature, and forming a second layer of metal oxide material, wherein the second layer of metal oxide is the oxidation product of the metal material and the second optically transparent substrate; and is disposed between the second optically transparent substrate and the metal feature, wherein the layer of metal material and the first and second layers of metal oxide form a first anodic bond between the first optically transparent substrate and the second optically transparent substrate.

The resulting device may be a substrate pair assembly including a first optically transparent substrate and a second optically transparent substrate, wherein the first substrate and second substrate are bonded together by a first anodic bond. The first anodic bond may further include a layer of metal material, and a first layer of metal oxide material wherein the metal oxide is the covalently bonded oxidation product of the metal material and the first optically transparent substrate, The first oxide layer may be disposed between the first optically transparent substrate and the metal layer, and a second layer of metal oxide material may be disposed between the second optically transparent substrate and the metal layer, wherein the second metal oxide is the covalently bonded oxidation product of the metal material and the second optically transparent substrate; and is.

The method results in the formation of an anodic, conductive bond between two glass substrates. One or more additional bonds may be formed laterally adjacent to the anodic bond. The additional one or more bonds may be thermocompression, a polymer, metal alloy, a solder, and a eutectic bond. Examples of appropriate thermocompression bonding techniques include gold (Au), silver (Ag), or platinum (Pt). and indium (In). The laterally adjacent bond may be selected to provide some additional attribute, for example like hermeticity, electrical conductivity, low rf loss, high adhesive strength, leak resistance, or thermal conductivity, that the anodic bond may lack.

BRIEF DESCRIPTION OF THE DRAWINGS

The present invention will be understood more fully from the following detailed description, and from the accompanying drawings, which however, should not be taken to limit the invention to the specific embodiments shown but are for explanation and understanding only. It should be understood that these drawings do not necessarily depict the structures to scale, and that directional designations such as "top," "bottom," "upper," "lower," "left" and "right" are arbitrary, as the device may be constructed and operated in any particular orientation.

FIGS. 1a and 1b are simplified cross sectional diagrams of a substrate pair assembly wherein two optically transparent glass substrates are bonded anodically to form a device cavity;

FIGS. 2a and 2b are simplified cross sectional diagrams of a substrate pair assembly wherein two optically transparent glass substrates are bonded anodically and with a second bond spaced laterally from the anodic bond;

FIGS. 9a and 9b are simplified profiles of a of bonding conditions, wherein one bond is formed under one set of conditions and the other bond is formed under the second set of conditions;

DETAILED DESCRIPTION

The systems and methods set forth herein are described with respect to a particular embodiment, that of a wafer pair assembly including a pair of optically transparent wafers joined by a first anodic bond. The wafer assembly may include a second bond in addition to the anodic bond. The systems and methods may be extended, however, to more than two optically transparent substrates and using any number of additional bonds using other bonding technologies. The methods and devices are particularly suitable with the use of an ion-rich glass such as Borofloat Glass®, Pyrex®, both borosilicate glasses, and fused silica are examples of suitable materials whose electrical conductivity is acceptably close to that of silicon. Borofloat glass, manufactured by Schott AG, is a highly chemically resistant borosilicate glass with significant conductivity that is produced using the float method, and having a composition of 81% $SiO_2$: 13% $B_2O_3$; 4% $Na_2O$/$K_2O$; and 2% $Al_2O_3$. Pyrex, developed by Corning, contains 80.6% $SiO_2$, 12.6% $B_2O_3$, 4.2% $Na_2O$, 2.2% $Al_2O_3$, 0.04% $Fe_2O_3$, 0.1% CaO, 0.05% MgO, and 0.1% Cl. However, it should be understood that a material having a substantial conductivity should be understood to mean any material whose resistivity is less than about 8 ohm-cm. It should be understood that this selection of materials may be applied to all the subsequently described embodiments shown in FIGS. 1-11. As a result of this selection of materials, the glass portion may conduct enough charge to support the application of the applied field and allow the anodic bond to form.

Figure 3:
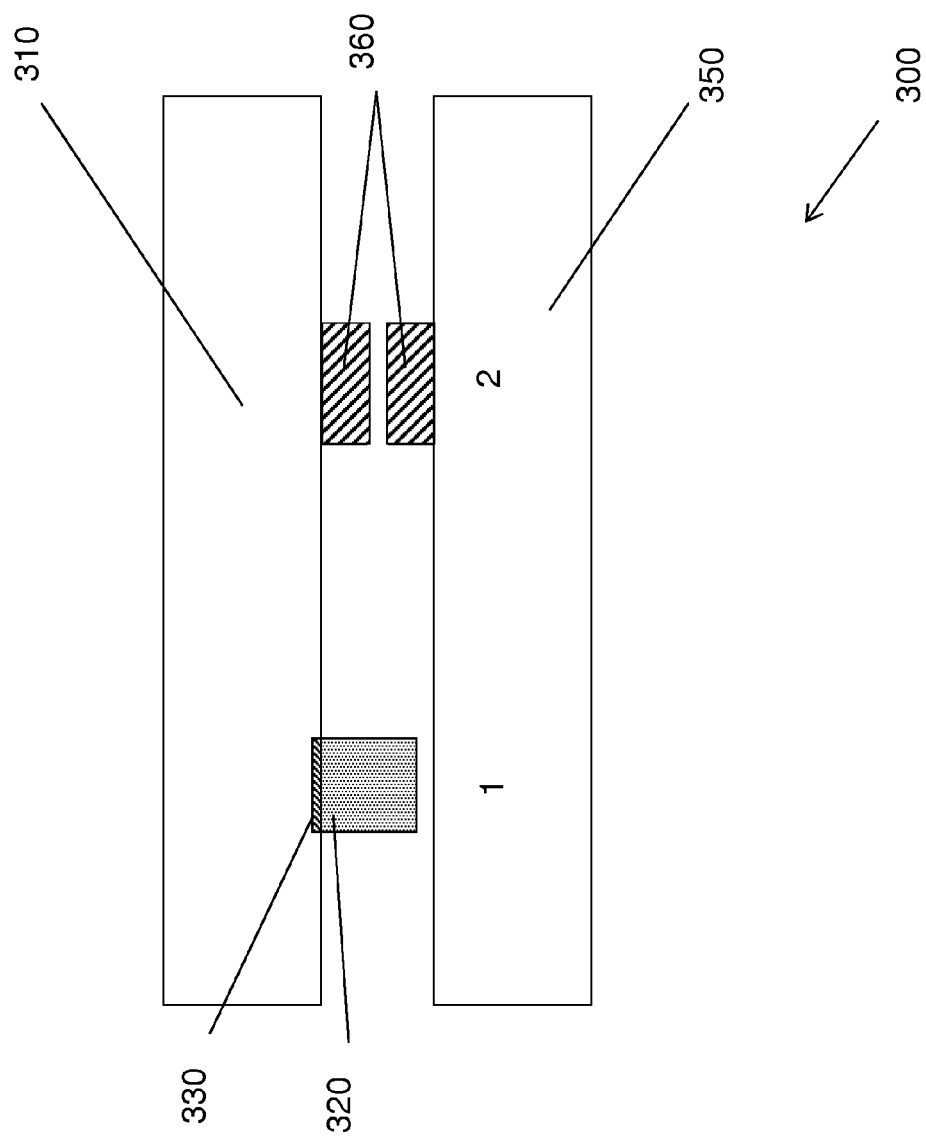
FIG. 3 is a simplified cross sectional diagram of a substrate pair assembly wherein the two adhesive layers are patterned on both substrates.

In the art, the term "wafer" is generally understood to refer to a generally circular, thin disk of material upon which a plurality of microfabricated devices may be fabricated. The word "substrate" may be understood to refer to any supporting surface, such as a wafer for example, or a wafer after the microfabricated devices have been singulated. The terms "wafer" and "substrate" have been used interchangeably herein, even though wafer generally suggests an intact, circular surface. They should both be understood to mean a supporting surface on which one or more microfabricated structures have been built. Specifically, "wafer" should be understood to include any portion of the intact, circular fabrication material, including singulated devices which have been separated from the intact, generally circular, fabrication material. FIG. 1 shows the anodic bond, FIGS. 2 and 3 show the anodic bond in addition to a laterally disposed adjacent bond, FIGS. 3-8 show various design options available for the additional bond, FIGS. 9-11 show bonding conditions under which the two bonds may be formed.

FIG. 1 is a simplified cross sectional diagram of a substrate pair 100 prior to bonding. An upper substrate 110 may have a layer of metal 120 formed thereon, wherein the layer of metal 120 is adhered to the upper substrate 110 by an oxide layer 130. The oxide layer 130 may be the oxidation product of the metal material 120 with the optically transparent substrate 110. For example, if the metal layer 120 is silicon and the optically transparent substrate is glass, the oxide layer 130 may be silicon dioxide $SiO_2$ wherein the oxidation has occurred while the silicon layer 120 is in contact with the glass substrate, or upon depositing that layer 120.

The metal layer may be any metal capable of forming an oxide with the material of the optically transparent substrate 110. Examples of suitable metal materials include of titanium (Ti), chromium (Cr), silicon (Si), cobalt (Co), aluminum (Al) and zirconium (Zr), but there may be others and this list is not meant to be exhaustive.

A suitable deposition method may be sputter deposition using a silicon target, or chemical vapor deposition. In either case, the result is a layer of metal at least about 500 nm thick and an oxide layer of at least about 0.3 nm in thickness. It should be understood that this oxide layer may be made thicker by exposing the structure to heat and/or voltage, which tends to grow and thicken the oxide until the reaction is quenched by the insulating characteristics of the oxide layer. After deposition, the metal layer 120 may be patterned to form isolated islands, contiguous lines or other features, or the metal layer 120 may remain a full film.

A microfabricated device 190 may be formed on the first optically transparent substrate 110 or a second optically transparent substrate 150. The microfabricated device may be virtually any integrated circuit or MEMS device, but devices which absorb, reflect, transmit, focus, emit or attenuate electromagnetic radiation may benefit particularly from the systems and methods presented here. In addition to the microfabricated device 190, there may be electrical traces (not shown) on either the first or the second optically transparent substrate. In some embodiments, it may be necessary or convenient to have electrical conductivity between traces formed on the upper substrate and traces formed on the lower substrate. The metal layer 120 may provide this conductivity. An exemplary microfabricated device may be, for example, the infrared emitter described in U.S. Pat. No. 7,968,986, issued Jun. 28, 2011 and incorporated by reference herein in its entirety.

With the metal layer 120 and oxide layer 130 formed thereon, the first optically transparent substrate 110 may be brought into contact with a second optically transparent substrate 150 to form a substrate pair assembly 100. Pressure may be applied between the wafers, as well as a combination of heat and voltage. The conditions may be chosen to promote the formation of a second layer of metal oxide 170 between the metal layer 120 and the second optically transparent substrate 150. This oxide layer 170 may be thicker, on the order of about 10 nm or more in thickness, compared to the first oxide layer 130. As before, the final thickness may be a function of the temperature, voltage and pressure applied to the substrate pair assembly 100, and the duration for which these conditions are applied. The oxide layer may be formed in a wafer bonding chamber which is equipped to provide these conditions to the wafer pair.

The two optically transparent glass substrates may therefore be bonded anodically to form a device cavity. The first optically transparent substrate 110 may be borofloat glass, for example, or any optically transparent, suitably conductive substrate material, and the second optically transparent substrate 150 may be the same or different material, but is also nominally conductive.

Upon removal from the wafer bonding chamber, the wafer pair assembly may look as shown in FIG. 1b. The anodic bond is formed by the metal layer 120 and its associated oxide layers 130 and 170. This anodic bond may form a perimeter around the microfabricated device 190, enclosing it in a protective device cavity. This anodic bond may have other advantageous features, such as hermeticity, or may provide electrical conductivity between the first and the second optically transparent substrates 110 and 150.

FIG. 2a shows a second embodiment of the substrate pair assembly 200. In FIG. 2a, the anodic bond formed from metal layer 220 has a second, laterally displaced second bond 260 formed also between the substrate pair assembly 200. In this and subsequent figures, the number: "1" designated the anodic bond and the number "2" denotes the second bond. The anodic bond may be formed before or after the second bond, so the numbers: "1" and "2" do not necessarily correspond to the order of formation. The second bond may be laterally separated from the anodic bond 1 by a distance or, for example, about 100 microns or more.

The second bond 2 may be, for example, a polymer, thermocompression, metal alloy, eutectic, a solder, or a metal alloy. Examples of appropriate thermocompression bonding technologies include gold (Au), silver (Ag), or platinum (Pt). and indium (In). Again, this list is not meant to be exhaustive. For solder or polymer bonds, the separation between the bond lines may be less than 100 microns because the bonding material partially liquefies during the process, making the material compliant and spreading it laterally by some amount.

In analogy with FIGS. 1a and 1b, the microfabricated device 290 may be disposed in a device cavity defined by an anodically bonded metal layer 220, This metal layer 220 may join a first optically transparent substrate 210 to a second optically transparent substrate 250 by virtue of two metal oxide layers 230 and 270. The second bond layer 260 may be formed on either the first optically transparent substrate 110 or the second optically transparent substrate 250 or both. The second bond features 260 may be patterned to have a particular shape and dimensions. Although the microfabricated device is not shown explicitly in all FIGS. 1-11, it should be understood that a microfabricated device may be disposed in the device cavity defined by the one or more bondlines.

The second bond 2 technology may be chosen to have different attributes that the first bond technology. For example, the second bond technology may be chosen to provide superior mechanical strength, whereas the first bond technology may be chosen to provide a conductive path between the first and the second optically transparent substrate. More generally, the first bonding mechanism may have an attribute selected from the group of hermeticity, electrically conductivity, low rf loss, high adhesive strength, leak resistance, thermal conductivity, and the second bond may provide a second, different attribute chosen from the same group.

FIG. 3 shows yet another embodiment, wherein a first optically transparent substrate 310 may be joined to a second optically transparent substrate 350 by a first anodic bond. The bond may be formed from metal layer 320, joined to the first optically transparent substrate 310 by a first oxide layer 330 and to a second optically transparent substrate 350 by a second oxide layer. The second oxide layer is not shown in FIG. 3, because substrates 310 and 350 are shown prior to bonding, and the second oxide layer has not yet been formed. A laterally distant second bond 360 may also join the first optically transparent substrate 310 and the second optically transparent substrate 350. In this embodiment, all bond features 320 and 360 may be patterned and may have specific dimensions chosen with the following considerations in mind.

In FIG. 3, the components of the first bond 320 are generally of the same size as the components of the second bond 360. Thus, the surfaces of first bond 320 may make contact at about the same time as the two components of second bond 360. It may be advantageous in some cases, however, to make the components different, as described below with respect to FIG. 4.

In analogy with FIGS. 1a and 1b, the microfabricated device (not shown) may be disposed in a device cavity defined by an anodically bonded metal layer 320, This metal layer 320 may join a first optically transparent substrate 310 to a second optically transparent substrate 350 by virtue of two metal oxide layers, a first oxide layer 330 and a second oxide layer between metal layer 320 and the second substrate 350. The second oxide layer is not shown in FIG. 4, because substrates 310 and 350 are shown prior to bonding, and the second oxide layer has not yet been formed. The second bond layer 360 may also join the first substrate 310 to the second substrate 350. Either the first optically transparent substrate 310 or the second optically transparent substrate 350 or both. The bond features 320 and 360 may be patterned to have the particular shape and dimensions shown in FIG. 3.

Figure 4:
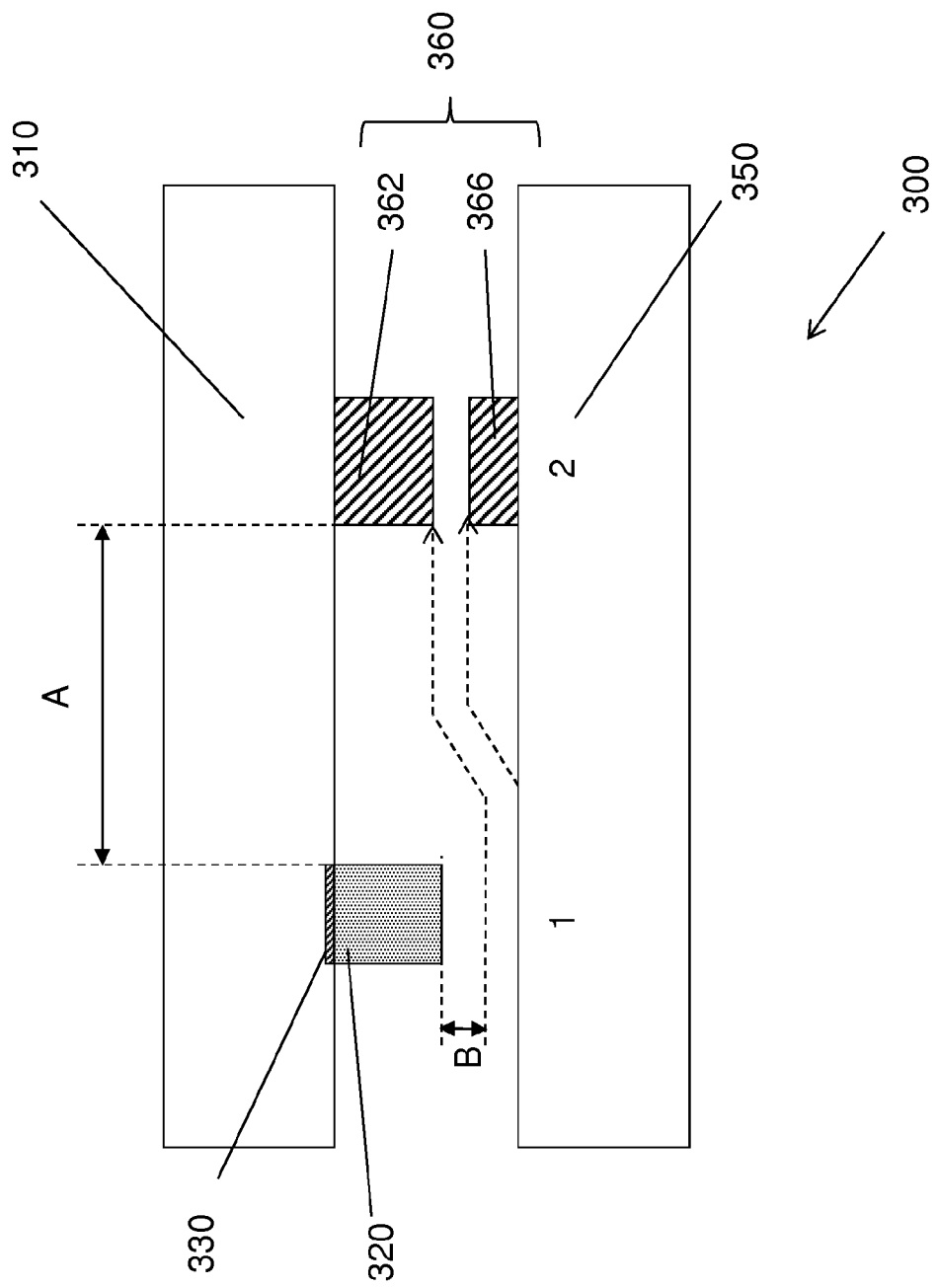
FIG. 4 is a simplified cross sectional diagram of a substrate pair assembly showing a height mismatch between the two patterned features on the substrates.

As shown in FIG. 4, it may be advantageous to form the components of the first bond 320 to have different shapes compared to its counterpart 362 of the second bond. In particular, the thickness of anodic metal layer 320 may be different than the thickness of the second bonding layer 362. More specifically, for a given lateral displacement A between the bond lines, the thickness of bonding layers 362 and 366 may be greater than the thickness of bonding element 320 by an amount B. Accordingly, the vertical distance B corresponds to the amount of additional travel between substrates 310 and 350 before a first contact is made between anodic bonding layer 320 and lower substrate 350. As can be seen in FIG. 4, upper layer 362 may contact lower layer 366 before anodic bonding layer 320 contacts the lower substrate 350. Thus, the bonding force on 320 may depend on the distance between the first bond line and the second bondline, as some of this bonding force is supported by the compliance of the substrate 310 across the lateral distance between the two bondlines. This lateral distance is denoted as "A" in FIG. 4. Generally, for commonly used glass substrates having a thickness of about 500 microns, a ratio of A/B of around 50 may be appropriate. Accordingly, in this situation and depending on the compliance of the first optically transparent substrate 310, the pressure on the second set of bonding elements 362 and 366 may exceed the pressure on the first anodic bonding element 320. For this reason, formation of the second bond 2 may precede formation of the first bond.1. However, the order of the bonding may be further influenced by conditions in the bonding chamber as described further below.

Figure 5:
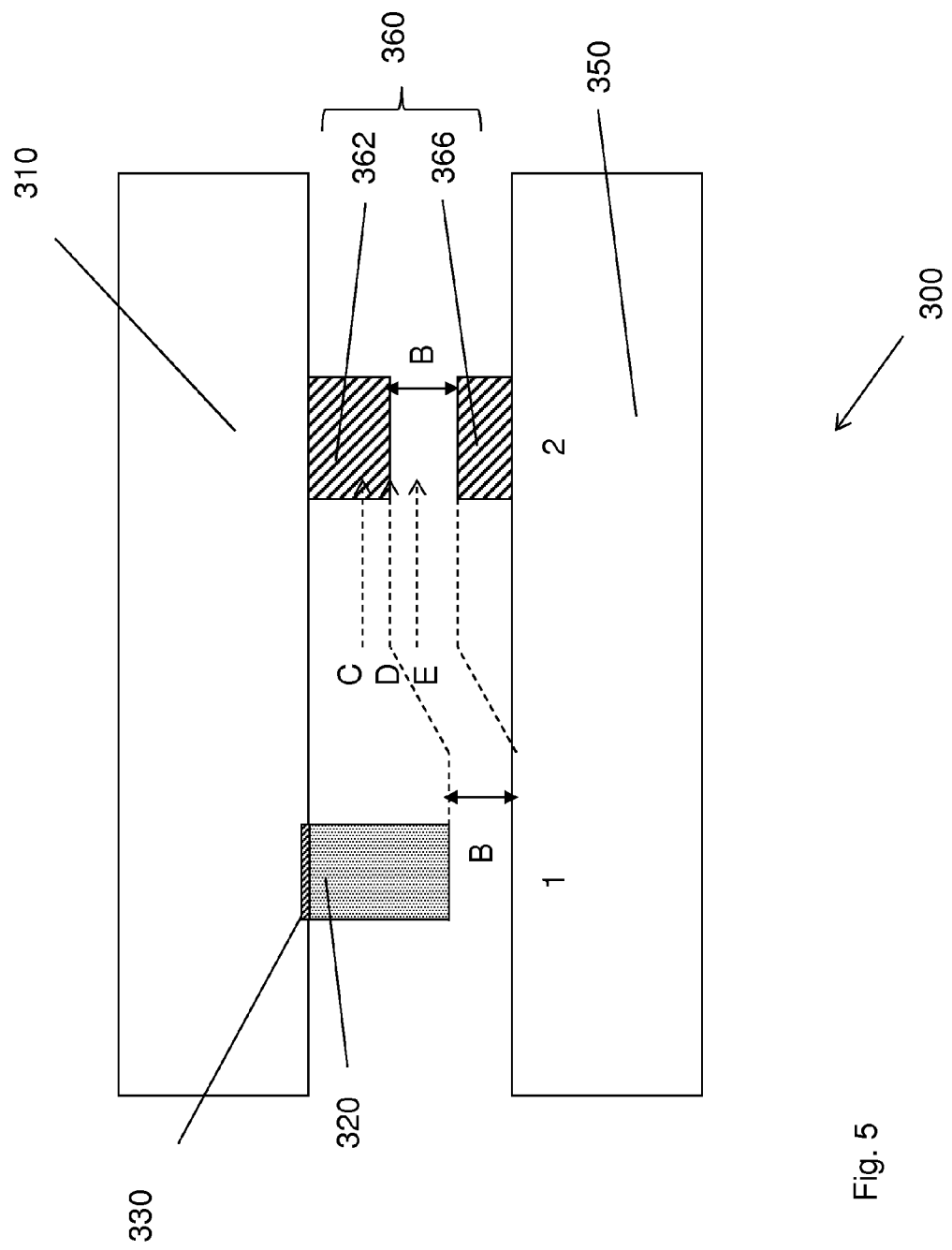
FIG. 5 is a simplified cross sectional diagram of a substrate pair assembly showing a height mismatch between a first patterned feature and a second patterned feature.

More generally, the situation may be as shown in FIG. 5. As before, elements 320 and 360 correspond to the elements of the first and the second bondlines on the first and the second optically transparent substrates, respectively. The anodic element 320 may be thinner (C), the same thickness as (D), or thicker (E) than the combined thicknesses of the first element 362 and the second element 366 of the second bondline 360. This relative height may determine the order of the contact of the respective surfaces, but may not determine the order of the bonding mechanisms 1 and 2. In one embodiment, the thickness of the anodic metal layer 320 may be about 50 nm thinner than the components of the second bondline, such that the components of the second bondline 360 make first contact. In this case, the second bondline may be displaced laterally from the first by about 500 nm. The bonding force on the metal bonding element 320 will then depend on the compliance of the substrate. In other words, the ratio of height mismatch to offset between the bondlines may be about 1:10 to 1:50, but will depend on the compliance of the substrate 310.

Figure 6:
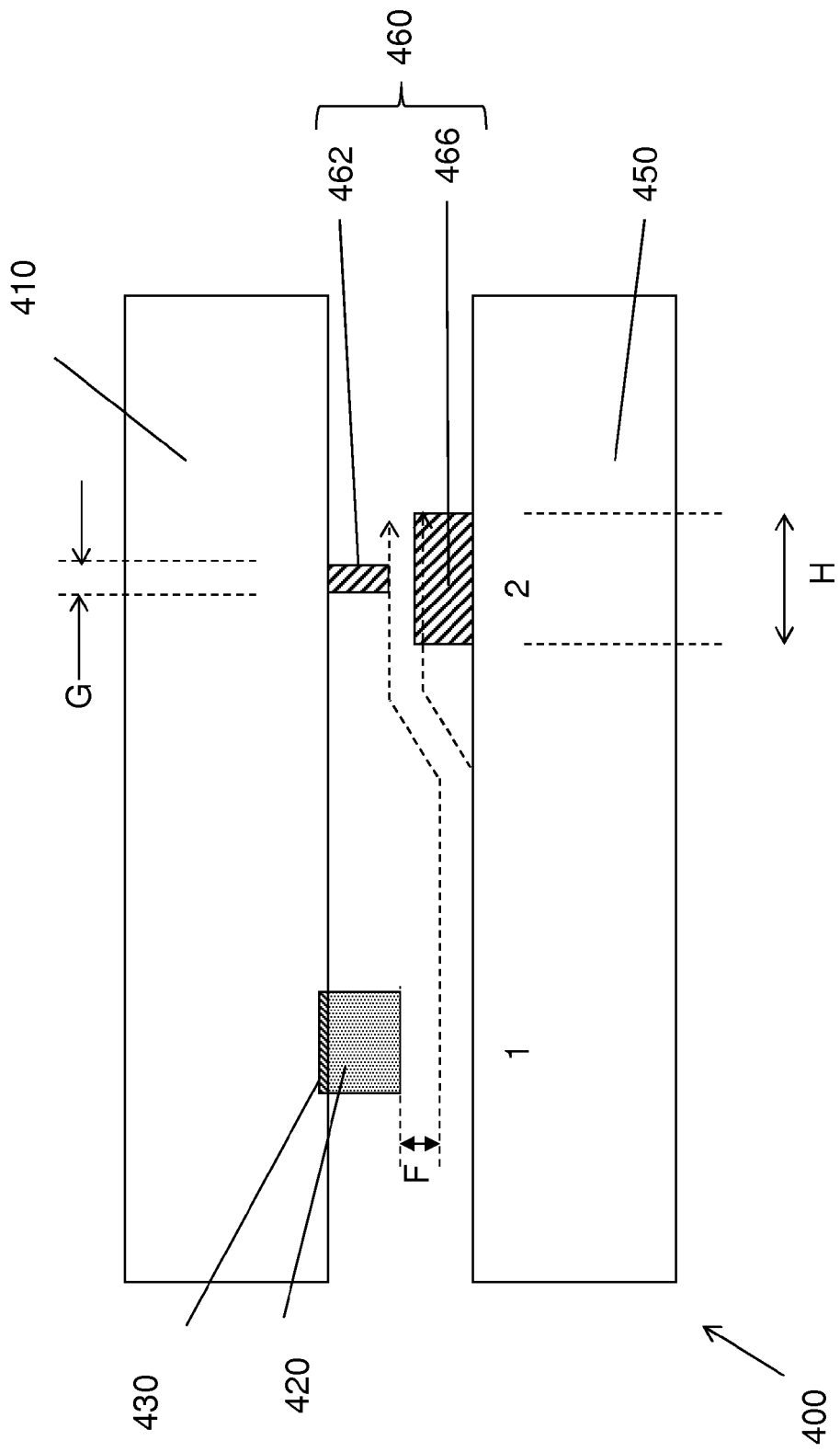
FIG. 6 is a simplified cross sectional diagram of a substrate pair assembly wherein one of the patterned features is formed of a size to concentrate pressure on this feature to form the bond.

FIG. 6 shows another embodiment of the substrate pair assembly 400. As before, the microfabricated device (not shown) may be disposed in a device cavity defined by an anodically bonded metal layer 420. Anodic metal layer 420 disposed on the first substrate 410, and may be bonded to the first substrate 410 by an oxide layer 430. Upon bonding with lower substrate 450, this layer 420 forms a second oxide layer which bonds the metal layer, and thus the upper substrate 410, to the lower substrate 450. Because FIG. 4 shows the substrates 410 and 450 prior to bonding, the second oxide layer is not shown, because the second oxide layer has not yet been formed. The second bond layer 460 may also join the first substrate 410 to the second substrate 450.

Similar to FIGS. 4 and 5, the second bond layer 460 may be formed of a first feature 462 and a second feature 466 on the first substrate 410 and the second substrate 450, respectively. The second bond features 462 and 466 may be patterned to have the particular shape and dimensions as shown in FIG. 6. The first optically transparent substrate 410 or the second optically transparent substrate 450 may be joined by the adhesive action of the first bond 1 and the second bond 2.

In this embodiment, the first feature of the second bonding technology 462 is patterned to have smaller dimensions than the feature 420 of the first bonding technology and smaller than second feature 466 of the second bonding technology. By making the first feature smaller, the pressure applied by feature 462 is commensurately higher than the pressure on the first feature 420 of the first bond 1.

More specifically, for a given lateral displacement A between the bond lines, the thickness of bonding layers 462 and 466 may be greater than the thickness of bonding element 420 by an amount F. Accordingly, the vertical distance F corresponds to the amount of additional travel between substrates 410 and 450 before a first contact is made between anodic bonding layer 420 and lower substrate 450.

If the bonding speed depends only on pressure, the second bond 2 will be formed before the first bond 1. In particular, when the first feature 462 contacts the second feature 466, the substrates must deform by an additional distance F before contact is made between the feature 420 and the lower substrate 450. Feature 462 may also have a width G which is thinner than the corresponding width H of the second feature of the second bonding technology 466. Accordingly, there will exist more pressure on the second bondline 460 in comparison to the first bondline 420. All other things being equal, the second bond may precede the first anodic bond. However, as described in more detail below, other parameters may be controlled to determine the order of the bonding for substrate pair assembly 400.

Figure 7:
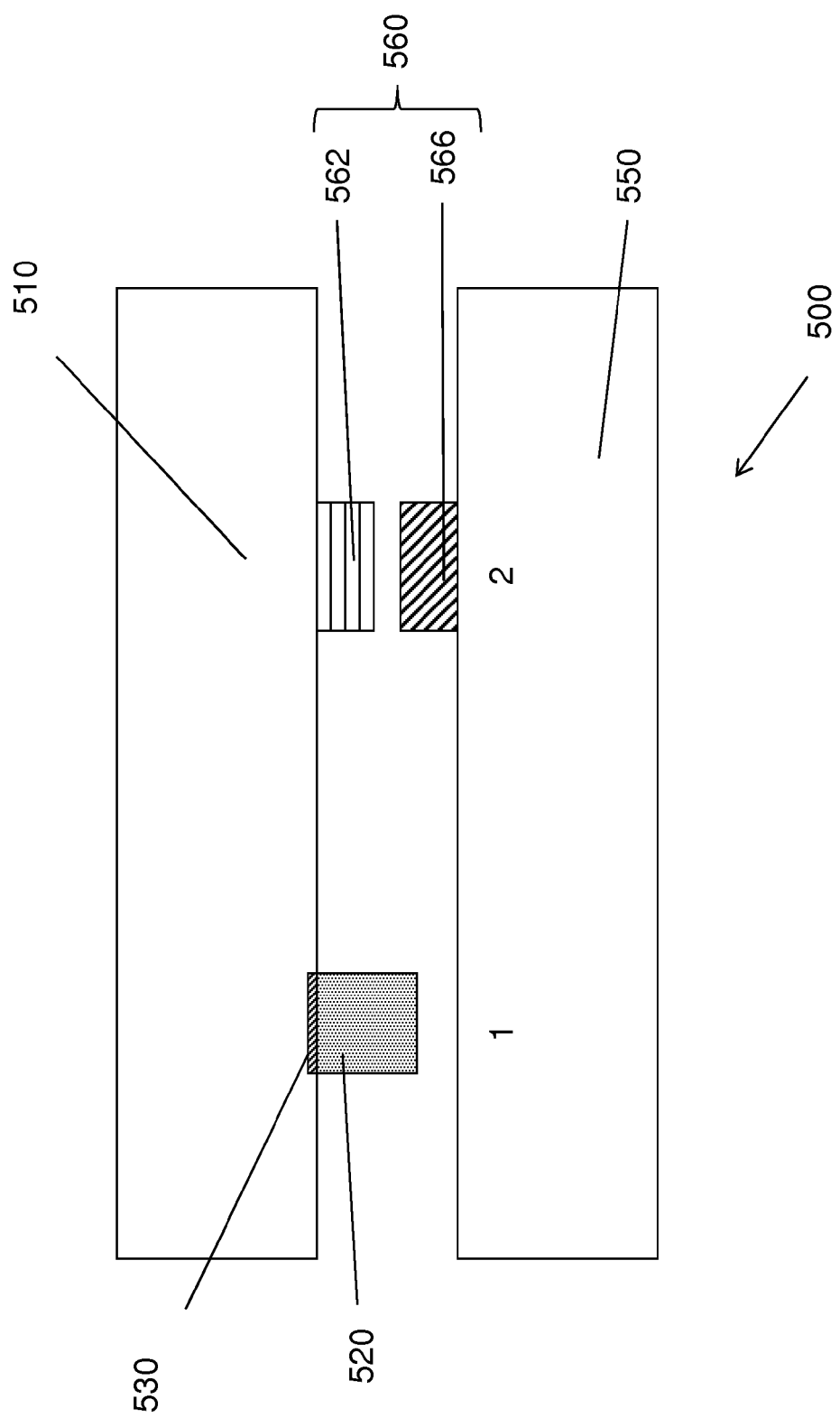
FIG. 7 is a simplified cross sectional diagram of a substrate pair assembly wherein one of the patterned features is a multilayer structure.

FIG. 7 shows another embodiment of the substrate pair assembly 500. As before, the microfabricated device (not shown) may be disposed in a device cavity defined by an anodically bonded metal layer 520. As before, this anodic layer 520 may formed on the first substrate 510 and mama a second substrate 550. This metal layer 520 may join the first optically transparent substrate 510 to a second optically transparent substrate 550 by virtue of a first metal oxide layers 530 and a second metal oxide layer. The second oxide layer is not shown in FIG. 7, because substrates 510 and 550 are shown prior to bonding, and the second oxide layer has not yet been formed. The second bond layer 560 may also join the first substrate 510 to the second substrate 550. The second bond layer 560 may be formed of a first feature 562 and a second feature 566 on the first substrate 510 and the second substrate 550, respectively. The second bond features 562 and 566 may be patterned to have the particular shape and dimensions as was shown in FIG. 4. The first optically transparent substrate 510 or the second optically transparent substrate 550 may be joined by the adhesive action of the first bond 1 and the second bond 2.

In this embodiment, the first feature of the second bonding technology 562 may be a patterned multilayer 562. The multilayer may have a compliance that is determined by the materials and dimensions of the multilayer 562. This multilayer feature 562 may also be thinner or thicker than the feature 520 of the first bonding technology. By making the first feature 562 more compliant, this feature 562 may make first contact. Nonetheless, the second bond may not necessarily precede the first bond, even though the pressure may be greater as explained further below.

Examples of the embodiment illustrated in FIG. 7 include any two or three metals that have a eutectic point of 400 Centigrade or less, such as silicon/gold, silicon\molydenum, silicon\silver. Alternatively, multilayers which can form a thermocompression bond may be used, including silver\silver, gold\gold, silver\gold, for example. In another alternative, low temperature solder bonding materials may be used, such as indium\gold, indium\silver, gold-tin/gold-copper-silver, indium\copper, antimony-lead/gold-copper-silver, just to name a few. Each layer in the multilayer stack may have a thickness of about 1-10 microns or more.

Figure 8:
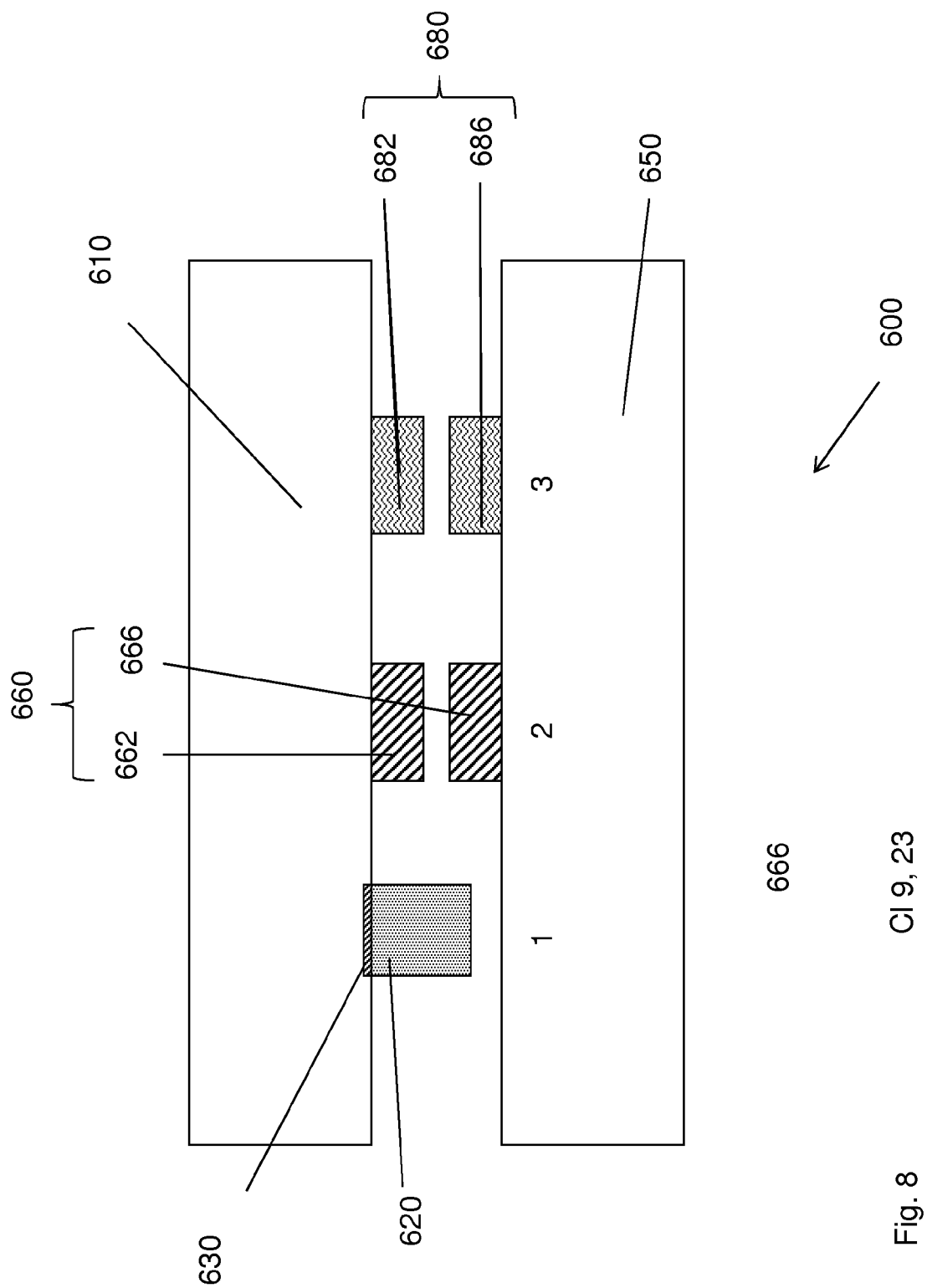
FIG. 8 is a simplified cross sectional diagram of a substrate pair assembly showing a third bond spaced laterally from the second bond.

FIG. 8 shows another embodiment of the substrate pair assembly 600. As before, the microfabricated device (not shown) may be disposed in a device cavity defined by an anodically bonded metal layer 620. This metal layer 620 may join a first optically transparent substrate 610 to a second optically transparent substrate 650 by virtue of a first metal oxide layer 630 and a second metal oxide layer. The second oxide layer is not shown in FIG. 8, because substrates 610 and 650 are shown prior to bonding, and the second oxide layer has not yet been formed. The second bond layer 660 may also join the first substrate 610 to the second substrate 650. The second bond layer 660 may be formed of a first feature 662 and a second feature 666 on the first substrate 610 and the second substrate 650, respectively. The second bond features 662 and 666 may be patterned to have the particular shape and dimensions shown in FIG. 3. The first optically transparent substrate 610 or the second optically transparent substrate 650 may be joined by the adhesive action of the first bond 1 and the second bond 2.

In this embodiment, a third bonding technology 3 may be employed in addition to the first two bonding technologies 1 and 2. The third bonding technology 3 may be, for example, a polymer, thermocompression, metal alloy, eutectic, a solder, a metal alloy and a eutectic bond. The first feature 682 of the third bonding technology 680 may be a patterned multilayer or dimensioned as described previously with respect to FIGS. 3-7. A corresponding feature 686 may be disposed on the second substrate to form the third bond 680 along with the first feature 682.

It should be understood that the concepts disclosed here may be extended to any number of additional bonding technologies. Each of the technologies may be employed for the same or a different purpose, and may be selected for the following attributes: hermeticity, electrical conductivity, low rf loss, high adhesive strength, leak resistance, thermal conductivity, FIGS. 9a and 9b are diagrams of a set of bonding conditions which may be applied in a substrate bonding chamber to determine the order and quality of the bonds formed. Shown in FIG. 9a is a temperature profile of a heating source that may be applied to the substrate pair assembly 100-600, as described previously. The temperature profile may include a lower temperature period followed by a higher temperature period, and these temperatures are plotted as a function of time in FIG. 9a. Simultaneously to the temperature profile shown in FIG. 9a, a voltage profile may be applied to substrate pair assemblies 100-600, as a function of time as shown in FIG. 9b. For example, if the first bond to be formed is an anodic bond, which proceeds at a certain temperature and voltage, these conditions may be applied in step 1. If a higher temperature is required for the second bond, but no voltage, these conditions may be applied in step 2. Accordingly, either the anodic bond technology or the second bond may proceed first, according to the conditions chosen for each step.

Figure 10A:
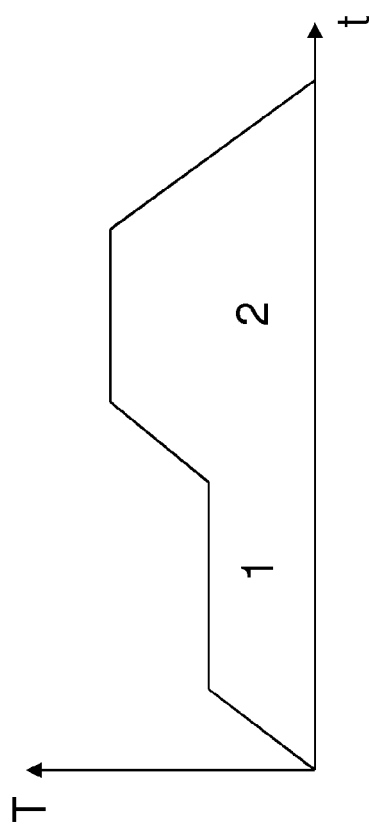
FIGS. 10a and 10b are simplified profiles of a second set of bonding conditions, wherein one bond is formed under one set of conditions and the other bond is formed under the second set of conditions.
Figure 10B:
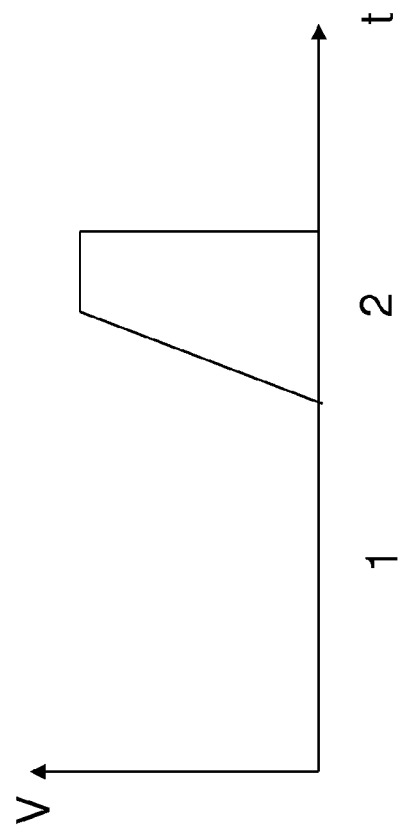

For example, if instead the anodic bond is to be achieved after the second bonding, the temperature and voltage profiles shown in FIGS. 10a and 10b may be applied. In FIG. 10a, a ramped temperature function is shown, wherein a first temperature is applied during a first step, and a second temperature is applied during a second step. However, in this embodiment, the higher voltage is not applied until the second step, during which the anodic bond may be formed.

Figure 11A:
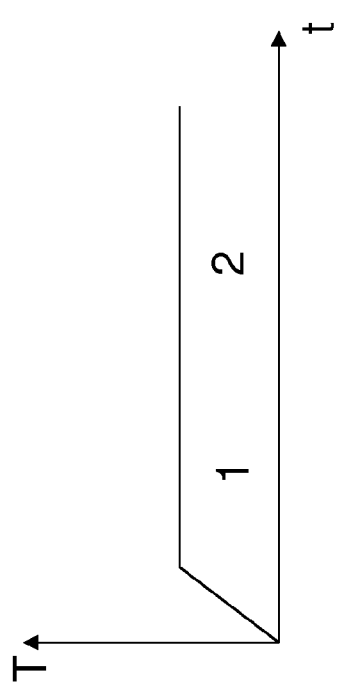
FIGS. 11a and 11b are simplified profiles of a second set of bonding conditions, wherein one bond is formed under one set of conditions and the other bond is formed under the second set of conditions.
Figure 11B:
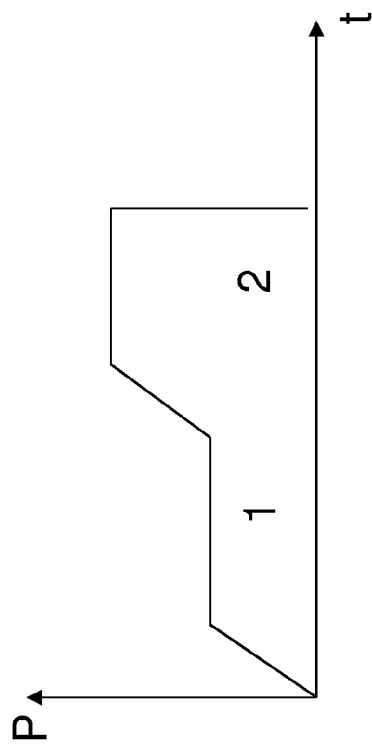

Lastly, FIGS. 11a and 11b show another embodiment of another set of bonding conditions. In FIG. 11a, the temperature profile shown is constant as a function of time. The order of the bonding in this example may be determined by the pressure applied between the substrates as shown in 11b. For a bonding technology requiring higher pressures but constant temperatures, this bond is not achieved until the second step.

It should be understood that the bonding parameters of temperature, voltage and pressure may be mixed and matched according to the bonding technologies being used. More generally, as illustrated in FIGS. 9a, 9b, 10a, 10b, 11a and 11b, a first combination bonding conditions may be applied in a first step, and a second set of bonding conditions may be applied in a second step. The bonding conditions may include temperature, pressure and voltage. Either the first step or the second step may achieve the anodic bond. The second bond may be achieved in the other step.

Of course, it should be clear that if the substrate pair assembly includes a third or further bonding technologies, a third step or ramp may be included in addition to the two shown.

It should also be clear that any of the concepts described above may be mixed or matched with any or all of the other concepts in terms of placement and dimensioning of the bonding features, and control of bonding chamber parameters.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to two bonded optically transparent substrates, it should be understood that the techniques and designs described above may be applied to any of a number of other materials, including optically opaque materials. Accordingly, the exemplary implementations set forth above, are intended to be illustrative, not limiting.

What is claimed is:

1. A method of forming a substrate pair assembly, comprising:
    providing a first optically transparent substrate and a second optically transparent substrate;
    depositing a first layer of metal material on the first optically transparent substrate;
    forming a first layer of metal oxide material wherein the metal oxide is the oxidation product of the metal material and the first optically transparent substrate, and is formed during the depositing of the metal material;
    patterning the first layer of the metal material to create a metal feature;
    forming a second layer of metal oxide material, wherein the second layer of metal oxide is the oxidation product of the metal material and the second optically transparent substrate; and is disposed between the second optically transparent substrate and the metal feature, wherein the layer of metal material and the first and second layers of metal oxide form a first anodic bond between the first optically transparent substrate and the second optically transparent substrate and forming a first layer of a second bonding material on at least one of the first and the second optically transparent substrate, and patterning the first layer to form a first feature of the second bonding material; and bonding the first optically transparent substrate to the second optically transparent substrate with a second bond of the second bonding material.

2. The method of claim 1, wherein forming the second layer of metal oxide comprises applying at least one of temperature, pressure and voltage to the first optically transparent substrate and the second optically transparent substrate for at least about 3 minutes, to form an anodic bond between the first and the second optically transparent substrates.

3. The method of claim 1, wherein the first anodic bond provides an attribute selected from the group of hermeticity, electrically conductivity, low rf loss, high adhesive strength, leak resistance, thermal conductivity, and the second bond provides a second, different attribute chosen from the same group.

4. The method of claim 1, wherein the second bond is laterally separated from the first anodic bond by a distance of about 100 microns or more.

5. The method of claim 1, wherein the second bond comprises one of a polymer, a thermocompression, a solder, a metal alloy and a eutectic bond.

6. The method of claim 1, wherein the second bond comprises a thermocompression bond using at least one of gold (Au), silver (Ag), platinum (Pt), and indium (In).

7. The method of claim 1, further comprising:
forming a second layer of the second bonding material on the other of the first and the second optically transparent substrates; and
patterning the second layer to form a second feature of the second bonding material.

8. The method of claim 7, wherein a width of the first feature of the second bonding material is between about 1 to about 5 microns wide, and a width of the second feature of the second bonding material is about 100 microns wide.

9. The method of claim 7, wherein the metal feature is about 500 nm thick, and a thickness of the first feature of the second bonding material is at least about 50 nm thicker than the thickness of the metal feature.

10. The method of claim 7, further comprising forming at least one of the first feature and the second feature of the second bonding material so as to have a yield strength of less that about 500 MPa, and applying a pressure of about 1.5 atm between the first and the second optically transparent substrates, in order to form the first anodic bond and the second bond.

11. The method of claim 7, wherein the thickness of at least one of the first feature and the second feature relative to a thickness of the metal feature determines whether the first anodic bond is formed before or after the second bond.

12. The method of claim 1, further comprising applying a first combination of temperature, pressure and voltage to achieve the first anodic bond, and a second combination of temperature, pressure and voltage sufficient to achieve the second bond with the second bonding material.

13. The method of claim 12, wherein the first combination of conditions and the second combination of conditions determines whether the first anodic bond is formed before or after the second bond.

14. The method of claim 1, wherein at least one of the first feature and the second feature of the second bonding material comprises a multilayer stack.

15. The method of claim 14, wherein the multilayer stack includes layers of silicon, gold, molydenum, silver, indium, tin, antimony, lead, and copper, each layer having a thickness of about 1-10 microns, and the multilayer stack having a yield strength of of less than about 500 MPa.

16. The method claim 1, further comprising:
forming a first layer of a third bonding material on at least one of the first and the second optically transparent substrates;
patterning the first layer of the third bonding material to form a first feature of the third bonding material; and
bonding the first optically transparent substrate to the second optically transparent substrate with the third bonding material.

17. The method of claim 1, further comprising:
forming a device on at least one of the first and the second optically transparent substrate; and
forming the metal layer in a perimeter around the device, wherein the anodic bond and the metal layer form a device cavity which encloses the device between the first and the second optically transparent substrate.

18. The method of claim 17, wherein the device comprises at least one of an emitter, detector, reflector or attenuator of electromagnetic radiation.

19. The method of claim 1, wherein the first optically transparent substrate and the second optically transparent substrate each have a resistivity of less than about 8 ohm-cm, and wherein the metal material comprises at least one of titanium (Ti), chrome (Cr), silicon (Si), cobalt (Co), aluminum (Al) and zirconium (Zr).

* * * * *